US012206037B2

(12) United States Patent
Gloeckler et al.

(10) Patent No.: US 12,206,037 B2
(45) Date of Patent: Jan. 21, 2025

(54) PHOTOVOLTAIC DEVICE WITH TRANSPARENT TUNNEL JUNCTION

(71) Applicant: First Solar, Inc., Tempe, AZ (US)

(72) Inventors: Markus Gloeckler, Perrysburg, OH (US); Fang Mei, Palo Alto, CA (US); Wei Zhang, San Jose, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 16/340,984

(22) PCT Filed: Oct. 11, 2017

(86) PCT No.: PCT/US2017/056092
§ 371 (c)(1),
(2) Date: Apr. 10, 2019

(87) PCT Pub. No.: WO2018/071509
PCT Pub. Date: Apr. 19, 2018

(65) Prior Publication Data
US 2019/0296174 A1    Sep. 26, 2019

Related U.S. Application Data

(60) Provisional application No. 62/407,260, filed on Oct. 12, 2016.

(51) Int. Cl.
*H01L 31/044*     (2014.01)
*H01L 31/0224*    (2006.01)
(Continued)

(52) U.S. Cl.
CPC .. *H01L 31/0725* (2013.01); *H01L 31/022466* (2013.01); *H01L 31/022483* (2013.01);
(Continued)

(58) Field of Classification Search
CPC ................. H01L 31/00–078; Y02E 10/50–60
(Continued)

(56) References Cited

U.S. PATENT DOCUMENTS

| | | | |
|---|---|---|---|
| 4,909,857 A | * | 3/1990 | Ondris ..................... C25D 9/08 |
| | | | 136/260 |
| 4,950,615 A | | 8/1990 | Basol et al. |

(Continued)

FOREIGN PATENT DOCUMENTS

| | | |
|---|---|---|
| CN | 202601634 U | 12/2012 |
| CN | 109037390 * | 12/2018 |

(Continued)

OTHER PUBLICATIONS

Ullal H S et al., "Polycrystalline Thin Film Photovoltaics: Research, Development, and Technologies", Conference Record of the IEEE Photovoltaic Specialists Conference, (2002), pp. 472-477, vol. CONF. 29.

(Continued)

*Primary Examiner* — Bach T Dinh
(74) *Attorney, Agent, or Firm* — MacMillan, Sobanski & Todd, LLC

(57) ABSTRACT

A photovoltaic device includes a substrate, a semiconductor stack and a transparent tunnel junction. The semiconductor stack includes an n-type layer selected from a first transparent conductive oxide layer, or a window layer, or both; and a p-type absorber layer disposed on the n-type layer, wherein the absorber layer consists essentially of CdSexTe(1-x), wherein x is from 1 to about 40 at. %. The transparent tunnel junction comprises a transparent interface layer of $Cd_yZn_{(1-y)}Te$ doped to be p+type, and a transparent contact layer doped to be n+type, and the interface layer is disposed between the p-type absorber layer and the transparent contact layer. In bifacial embodiments, the tunnel junction (Continued)

forms a transparent back contact and electrode; and in multi-junction embodiments, the tunnel junction forms a diode-like connector between top and bottom cells. The transparent contact layer may comprise tin oxide or zinc oxide doped with aluminum, fluorine or indium. The photovoltaic device may also include an electron reflector layer and/or an optical reflector layer.

21 Claims, 9 Drawing Sheets

(51) Int. Cl.
    *H01L 31/0296* (2006.01)
    *H01L 31/0725* (2012.01)
    *H01L 31/073* (2012.01)
(52) U.S. Cl.
    CPC ........ *H01L 31/0296* (2013.01); *H01L 31/073* (2013.01); *Y02E 10/543* (2013.01)
(58) Field of Classification Search
    USPC ............................................... 136/243–265
    See application file for complete search history.

(56) References Cited

U.S. PATENT DOCUMENTS

| | | | |
|---|---|---|---|
| 5,261,969 A * | 11/1993 | Stanbery | H01L 31/0749 257/E31.007 |
| 5,474,939 A | 12/1995 | Pollock | |
| 5,909,632 A | 6/1999 | Gessert | |
| 5,922,142 A * | 7/1999 | Wu | H01L 31/1884 136/260 |
| 6,288,325 B1 | 9/2001 | Jansen | |
| 6,537,845 B1 | 3/2003 | McCandless et al. | |
| 7,141,863 B1 | 11/2006 | Compaan | |
| 8,124,870 B2 | 2/2012 | Woods | |
| 8,198,529 B2 | 6/2012 | Roberts et al. | |
| 8,252,624 B2 | 8/2012 | Tanner | |
| 8,791,356 B2 | 7/2014 | Kabade | |
| 9,054,241 B2 | 6/2015 | Korevaar et al. | |
| 9,147,778 B2 | 9/2015 | Zafar et al. | |
| 9,269,849 B2 | 2/2016 | Yu et al. | |
| 9,698,285 B2 | 7/2017 | Damjanovic et al. | |
| 9,853,177 B2 | 12/2017 | Yu et al. | |
| 9,871,154 B2 | 1/2018 | Duggal et al. | |
| 10,062,800 B2 | 8/2018 | Blaydes et al. | |
| 10,141,473 B1 | 11/2018 | Blaydes et al. | |
| 10,243,092 B2 | 3/2019 | Damjanovic et al. | |
| 11,769,844 B2 | 9/2023 | Damjanovic et al. | |
| 11,784,278 B2 | 10/2023 | Andreini et al. | |
| 11,817,516 B2 | 11/2023 | Damjanovic et al. | |
| 2005/0012113 A1* | 1/2005 | Sheu | H01L 31/1085 257/184 |
| 2006/0144435 A1 | 7/2006 | Wanlass | |
| 2009/0078318 A1* | 3/2009 | Meyers | H01L 31/073 136/260 |
| 2009/0235986 A1 | 9/2009 | Hotz et al. | |
| 2009/0308437 A1* | 12/2009 | Woods | H01L 31/022425 136/255 |
| 2010/0015753 A1* | 1/2010 | Garnett | H01L 31/02966 438/84 |
| 2010/0024876 A1 | 2/2010 | McClary | |
| 2010/0068849 A1 | 3/2010 | Lu | |
| 2011/0139249 A1* | 6/2011 | Garnett | H01L 31/073 257/E31.003 |
| 2011/0143489 A1* | 6/2011 | Korevaar | H01L 21/02562 438/84 |
| 2011/0168250 A1* | 7/2011 | Lin | H01L 31/068 438/98 |
| 2012/0060923 A1* | 3/2012 | Zhao | H01L 31/073 136/260 |
| 2012/0097222 A1* | 4/2012 | Gessert | C03C 17/2453 136/252 |
| 2012/0145240 A1* | 6/2012 | Carcia | B32B 17/10018 136/258 |
| 2012/0192923 A1* | 8/2012 | Korevaar | H01L 31/056 136/249 |
| 2012/0305064 A1 | 12/2012 | Johnson | |
| 2013/0074912 A1 | 3/2013 | Walukiewicz et al. | |
| 2013/0192656 A1 | 8/2013 | Hardin | |
| 2013/0230944 A1* | 9/2013 | Feldman-Peabody | H01L 31/022483 438/94 |
| 2013/0319502 A1 | 12/2013 | Chawla et al. | |
| 2014/0000690 A1 | 1/2014 | Plotnikov | |
| 2014/0000692 A1* | 1/2014 | Fogel | H01L 31/022425 136/256 |
| 2014/0209149 A1 | 7/2014 | Mascarenhas | |
| 2014/0216534 A1* | 8/2014 | Hong | H01L 31/03762 136/255 |
| 2014/0216542 A1* | 8/2014 | Shao | H01L 31/1828 136/256 |
| 2014/0216550 A1* | 8/2014 | Damjanovic | H01L 31/02966 136/260 |
| 2014/0217408 A1 | 8/2014 | Hong et al. | |
| 2014/0261667 A1 | 9/2014 | Buller | |
| 2014/0284750 A1* | 9/2014 | Yu | H01L 31/022425 257/436 |
| 2014/0326315 A1 | 11/2014 | Blaydes et al. | |
| 2015/0171260 A1* | 6/2015 | Liu | H01L 31/073 438/95 |
| 2015/0207011 A1 | 7/2015 | Garnett | |
| 2015/0270419 A1* | 9/2015 | Yuda | H01L 31/022425 438/98 |
| 2015/0325718 A1 | 11/2015 | Wolden et al. | |
| 2015/0357502 A1 | 12/2015 | Basol | |
| 2016/0060468 A1* | 3/2016 | Kim | H01L 31/022491 428/323 |
| 2016/0126395 A1 | 5/2016 | Damjanovic | |
| 2016/0126397 A1* | 5/2016 | Yu | H01L 31/02167 136/256 |

FOREIGN PATENT DOCUMENTS

| | | | |
|---|---|---|---|
| DE | 102012102492 | A1 | 9/2013 |
| WO | 2013009857 | A1 | 1/2013 |
| WO | 2015095607 | A1 | 6/2015 |

OTHER PUBLICATIONS

Heisler et al., "Transparent CdTe Solar Cells with a ZnO:Al Back Contact", Thin Solid Films, (2013), pp. 627-631, vol. 548.
J. Nagle, "Quantum Efficiency as a Device-Physics Interpretation Tool for Thin-Film Solar Cells", Dept. of Physics, Thesis (2007), Colorado State University, Fort Collins, Colorado.
Macdonald et al., "Layer-by-Layer Assembly of Sintered $CdSe_xTe_{1-x}$ Nanocrystal Solar Cells", American Chemical Society, (2012), vol. 6, No. 7, pp. 5995-6004.
Chanda, "Copper Doped Window Layer for CdSe Solar Cells", Graduate Thesis and Dissertations, University of South Florida, Scholar Commons, (2008).
Zeng, Xianwu, and Gan, Yong, "Nanocomposites for Photovoltaic Engergy Conversion," Advances in Composite Materials for Medicine and Nanotechnology, chapter 8, pp. 211-266, (2011) College of Engineering, University of Toledo, Toledo, Ohio.
Simchi, Hamed, "Back Surface Studies of Cu(In,Ga)Se2 Thin Film Solar Cells", Thesis (2014), University of Delaware.
Guntur, Vasudha, "Molybdenum Nitride Films in the Back Contact Structure of Flexible Substrate CdTe Solar Cells", Graduate Thesis (2011), University of South Florida.
A. D. Compaan et al., "Critical Issues and Research Needs for CdTe-Based Solar Cells", Electrochemical Soc. Symposium Proceedings, (1999), pp. 241-251.
Wei and Zhang, "Theoretical Study of Doping Limits of CdTe", NCPV Program Review Meeting, Lakewood Colorado, (2001), NREL/CP 590-31012.
Chin, "p-Doping Limit and Donor Compensation in CdTe Polycrystalline Thin Film Solar Cells", Solar Energy Materials and Solar Cells, (2010), pp. 1627-1629, vol. 94, issue 10.

(56) References Cited

OTHER PUBLICATIONS

Fang et al., "Achievements and Challenges of CdS/CdTe Solar Cells", International Journal of Photoenergy, (2011), pp. 1-8, Article ID 297350.
"Multi-Junction Solar Cell", Wikipedia, last modified Apr. 12, 2016, downloaded Apr. 20, 2016, pp. 1-18.
Lin, Gui Jiang, et al., "III-V Multi-Junction Solar Cells", Optoelectronics—Advanced Materials and Devices, Chapter 18 pp. 445-471 (2013), DOI: 10.5772/50965.
Feng et al., "Preparation and characterization of ZnTe as an interlayer for CdS/CdTe substrate thin flim solar cells on flexible substrates", Thin Solid Films 535, (2013), pp. 202-205.
Li et al., Electrical Characterization of Cu Composition Effects in CdS/CdTe Thin-Film Solar Cells with a ZnTe:Cu Back Contact, National Renewable Energy Laboratory, (Jun. 3-8, 2012), pp. 1-6.
Narayanswamy et al., "Analysis of Cu Diffusion in ZnTe-Based Contacts for Thin-Fim CdS/CdTe Solar Cells", National Renewable Energy Laboratory (Sep. 8-11, 1998) pp. 1-6.
International Search Report and Written Opinion of the International Search Authority, dated Jan. 22, 2018, Application No. PCT/US2017/056092, filed Oct. 11, 2017.
European Office Action, Application No. 17795098.7, dated Sep. 13, 2019.
Japanese Office Action, dated Nov. 7, 2019, Application No. 2019-519718.
European Patent Office. Extended European Search Report for European application No. 20183311.8, mailed Sep. 2, 2020, pp. 1-10.
Intellectual Property India, Examination Report, dated Dec. 2, 2021, Indian Patent Application 201917015775.
National Intellectual Property Administration, P.R. China, Office Action, dated Dec. 15, 2021, Chinese Patent Application No. 201780076542.9.
Government of India Patent Office, Indian Office Action, dated Oct. 30, 2023, Application No. 201917015775.

* cited by examiner

PHOTOVOLTAIC DEVICE WITH TRANSPARENT TUNNEL JUNCTION

CROSS-REFERENCE TO RELATED APPLICATIONS

This is a national phase application of international application PCT/US2017/056092, filed under the authority of the Patent Cooperation Treaty on Oct. 11, 2017, published Apr. 19, 2018; which claims the benefit of U.S. Provisional Application No. 62/407,260, filed under 35 U.S.C. § 111 (b) on Oct. 12, 2016, which is incorporated by reference herein in its entirety.

BACKGROUND

A photovoltaic device generates electrical power by converting light into direct current electricity using semiconductor materials that exhibit the photovoltaic effect. The photovoltaic effect generates electrical power upon exposure to light as photons are absorbed within the semiconductor material to excite electrons to a higher energy state. These excited electrons are thus able to move within the material, thereby causing current.

A basic unit of photovoltaic (PV) device structure, commonly called a cell, may generate only small scale electrical power. Thus, multiple cells may be electrically connected together in series or parallel to aggregate the total power generated among the multiple cells within a larger integrated device, called a module or panel. A photovoltaic cell may further comprise a protective back layer and encapsulant materials to protect the cells from environmental factors. Multiple photovoltaic modules or panels can be assembled together in series or parallel to create a photovoltaic system, or array, capable of generating significant electrical power up to levels comparable to other types of utility-scale power plants. In addition to photovoltaic modules, a utility-scale array would further include mounting structures, electrical equipment including inverters, transformers, and other control systems. Considering the various levels of device, from individual cell to utility-scale arrays containing a multitude of modules, all such implementations of the photovoltaic effect may contain one or more photovoltaic devices to accomplish the energy conversion.

Thin film photovoltaic devices are typically made of various layers of different materials, each serving a different function, formed on a substrate. A thin film photovoltaic device includes a front electrode and a back electrode to provide electrical access to the photoactive semiconductor layer or to other layers that are sandwiched there-between.

Conventional thin film solar cells have modest conversion efficiencies for converting light into direct current electricity. Thus, a key area in the field of PV devices is the improvement of the conversion efficiency.

One challenge to achieving higher efficiency is the difficulty in creating a satisfactory back contact for ohmic contact and charge carrier transport. Another challenge is the reduction of back surface hole-electron recombination. A further challenge is improving the collection of light. This includes collecting reflected light and collecting light over a broad spectrum, including harvesting more infrared (IR) photons. Collection of charge carriers from both visible light and IR using conventional methods is impaired and inefficient, because the absorber layer thickness needed for IR absorption leads to minimal charge carrier creation or to charge carrier creation outside the depletion region. Diffuse light and light reflected off the ground and off nearby structures is available light that goes uncollected by conventional PV devices because it is reflected away by the rear of a solar panel, or is converted to heat.

Despite many improvements developed for ever increasing conversion efficiencies, there remains a continuing need for improved thin film PV devices that minimize absorption losses while capturing or recovering the maximum amount of solar radiation practicable.

DRAWINGS

Figure 1:
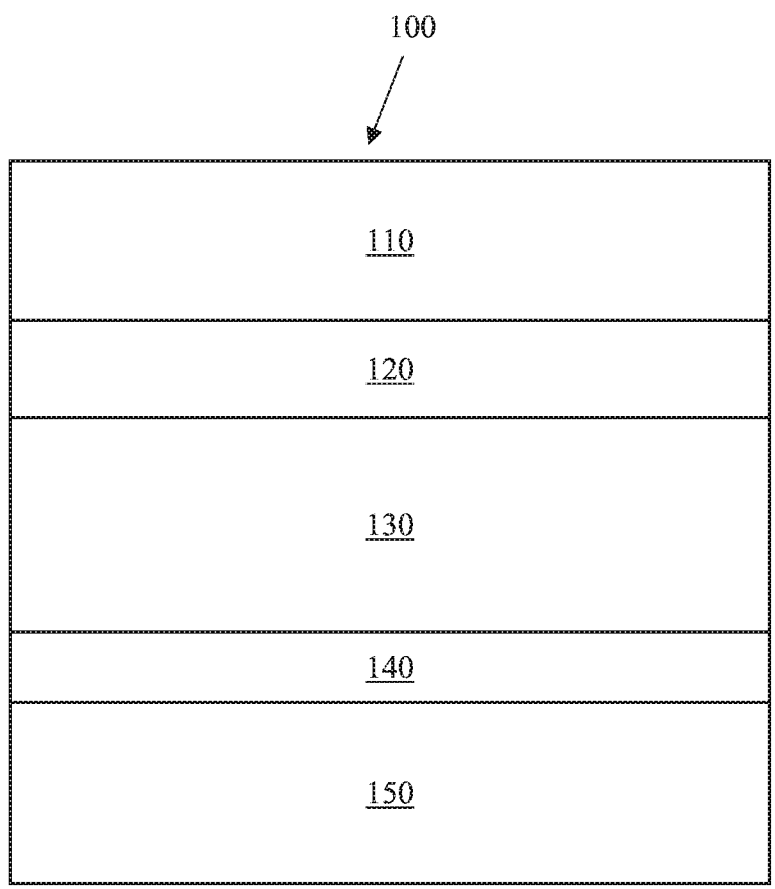
FIG. 1 depicts a schematic of functional layers in a first embodiment photovoltaic device.
Figure 4:
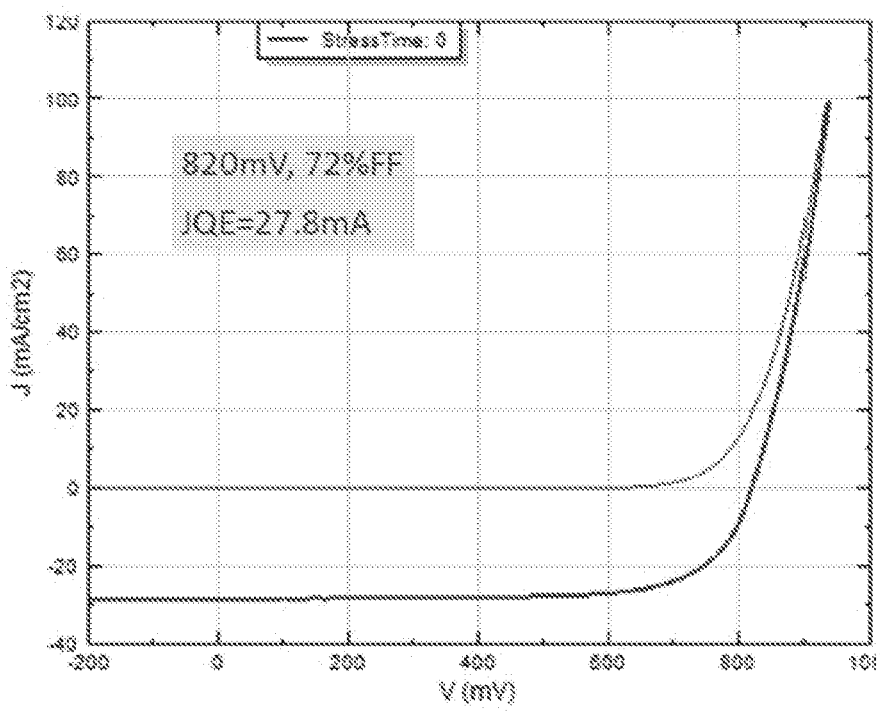

FIG. 4 provides I-V curves for an exemplary bifacial embodiment of FIG. 1.

Figure 5:
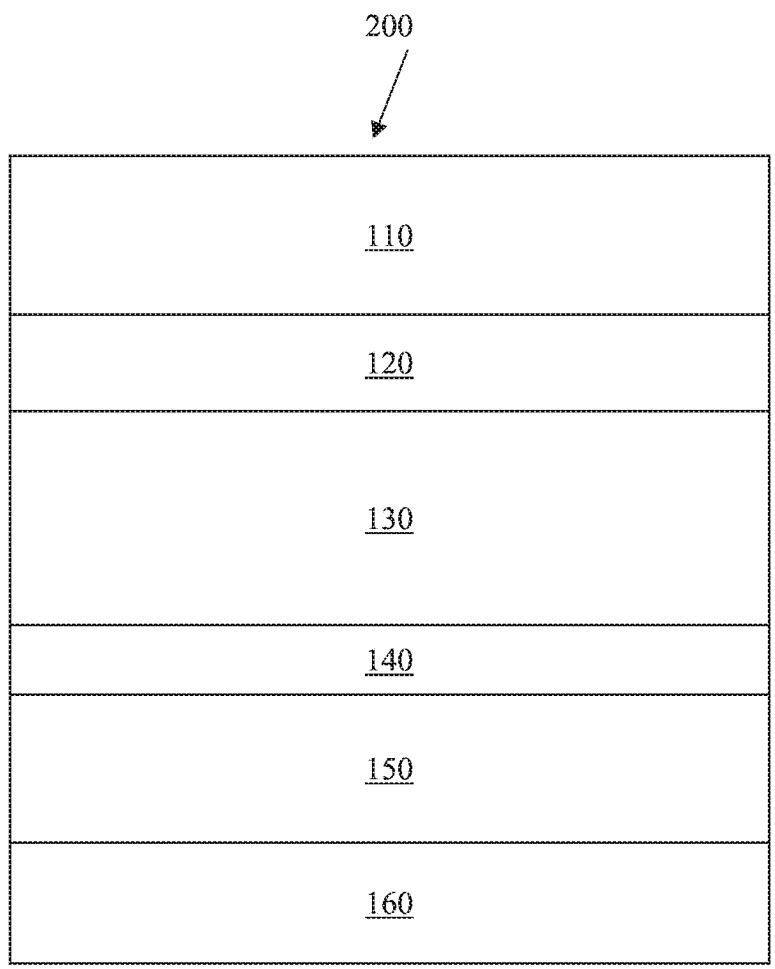

FIG. 5 depicts a schematic of functional layers in a second embodiment of a photovoltaic device.

Figure 6:
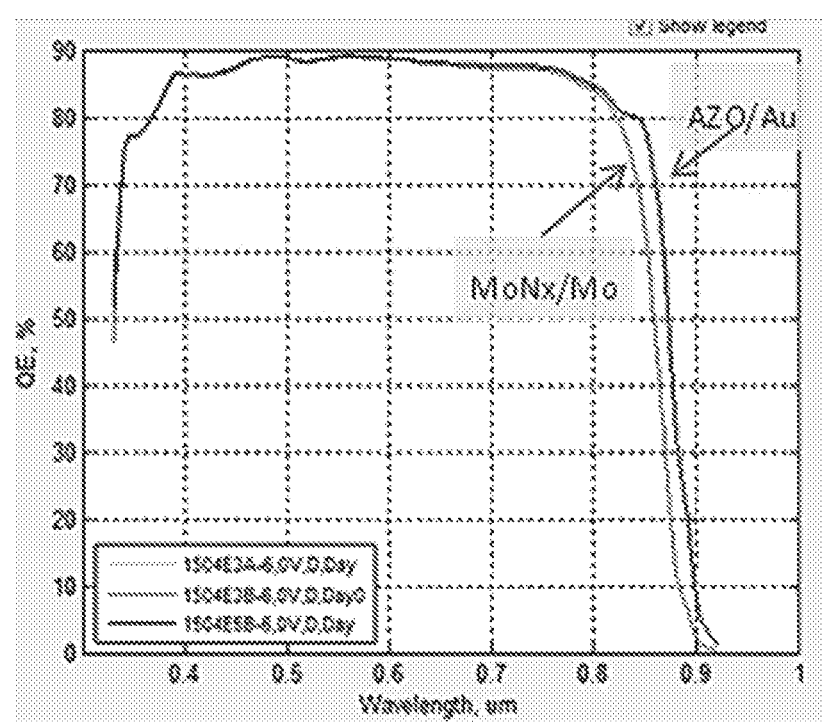

FIG. 6 is a QE comparison between a molybdenum nitride (MoNx/Mo) bilayer back contact and an exemplary embodiment of FIG. 5 with an AZO/Au back contact.

Figure 7A:
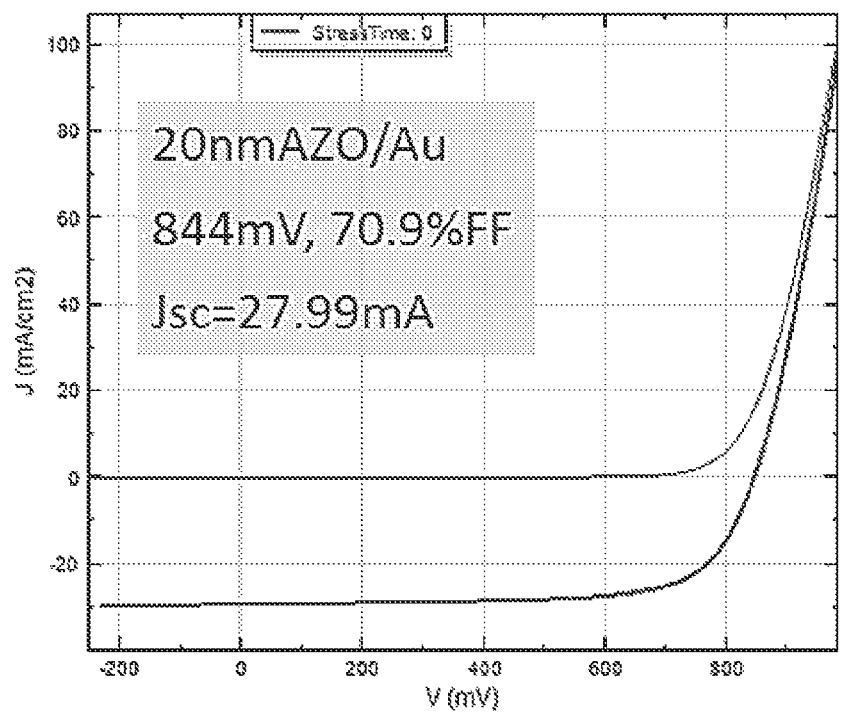

FIG. 7A shows an I-V curve of the performance of an exemplary embodiment of FIG. 5 with an AZO/Au bilayer back contact of thickness 20 nm.

Figure 7B:
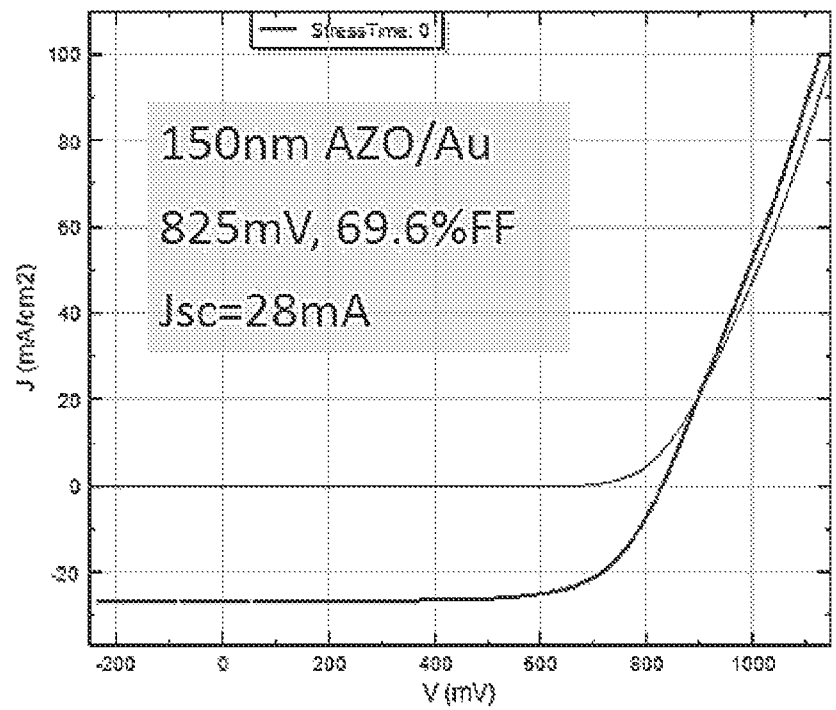

FIG. 7B shows an curve of the performance of an exemplary embodiment of FIG. 5 with an AZO/Au bilayer back contact of thickness 150 nm.

Figure 8:
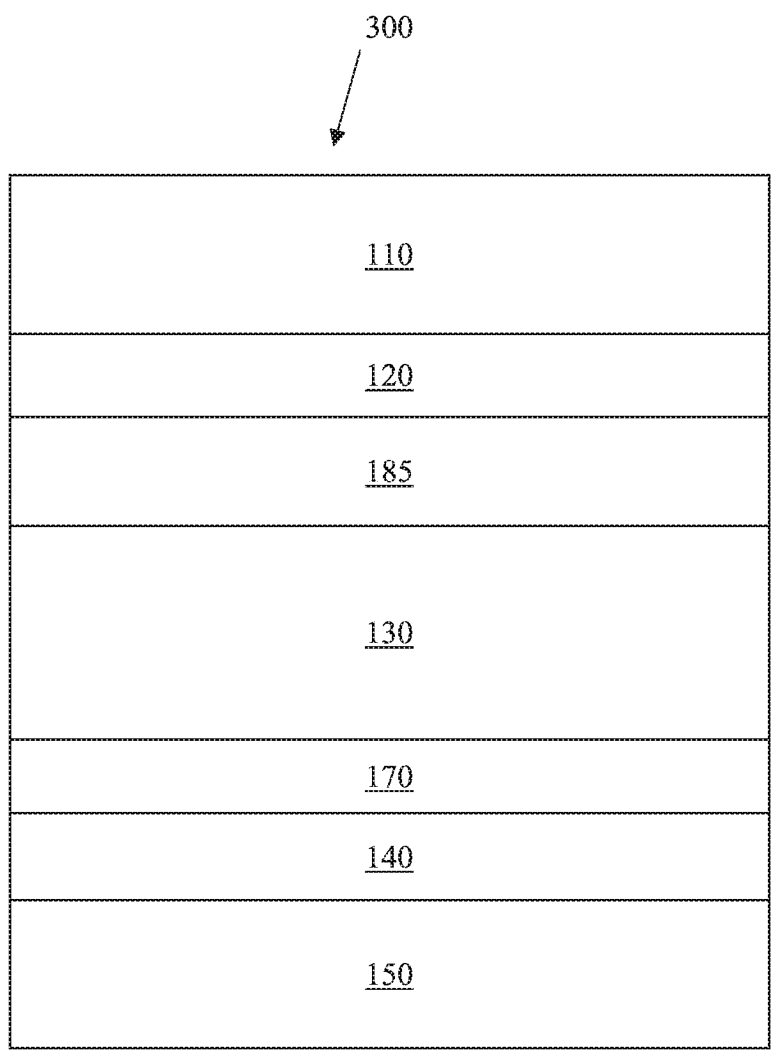

FIG. 8 depicts a schematic of functional layers in a third embodiment of a photovoltaic device.

Figure 9:
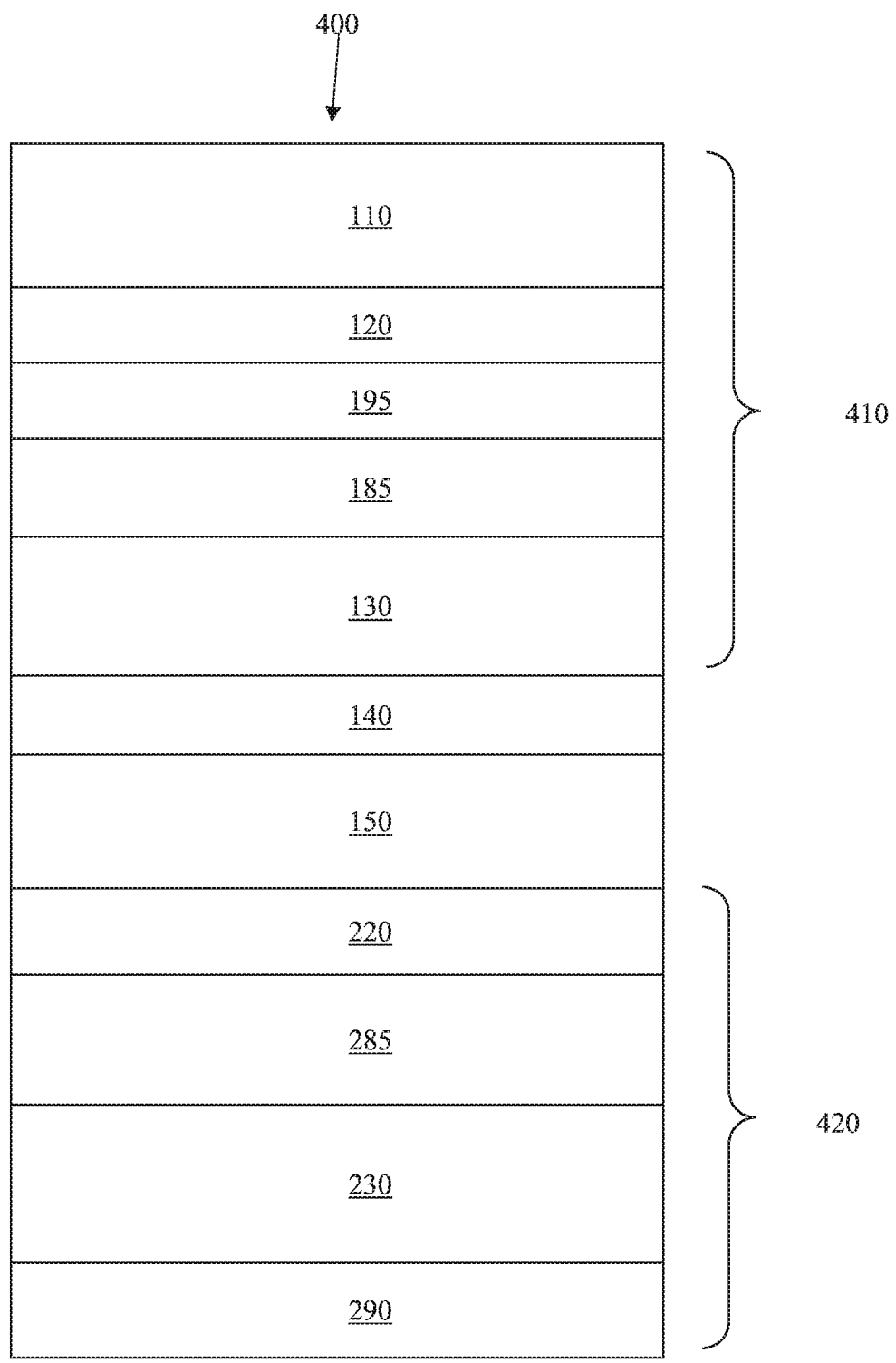

FIG. 9 depicts a schematic of functional layers in a multi-junction embodiment.

Figure 10:
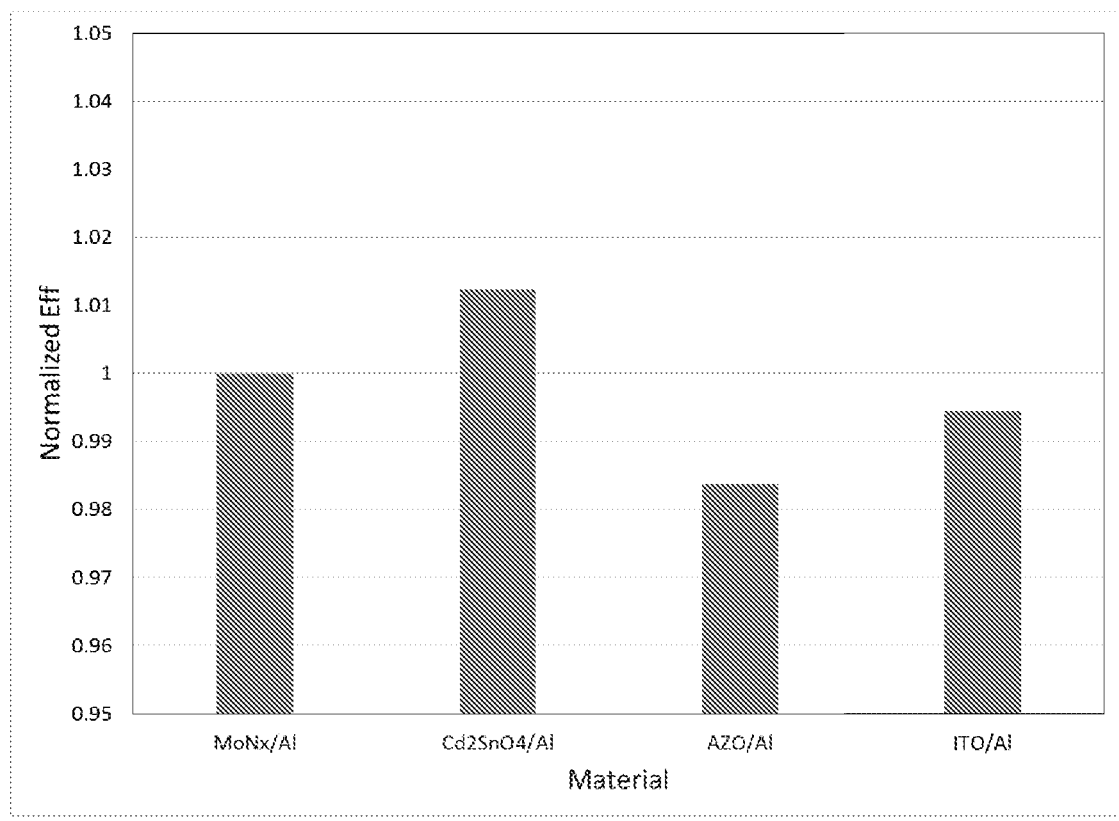

FIG. 10 shows the efficiency of several variations of transparent back contacts normalized to the standard of MoNx/Al.

DETAILED DESCRIPTION

Provided are structures and compositions for use in photovoltaic (PV) devices. Embodiments provide thin film photovoltaic devices having an n-type transparent back contact layer. Embodiments include thin film layers comprising a tunnel junction, an optical reflector, and/or an electron reflector.

The detailed description provided below in connection with the appended drawings is intended as a description of examples and is not intended to represent the only forms in which the examples may be constructed or utilized. The description sets forth the functions of the examples and the sequence of steps for operating with the examples. However, the same or equivalent functions and sequences may be accomplished by equivalent alternative examples.

The following detailed description is not intended to limit the invention, or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically inconsistent.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Each of the layers described in the following embodiments may be composed of more than one layer or film. Each layer can cover all or a portion of the PV device and/or all or a portion of the layer or material underlying the layer. For example, a "layer" can mean any, amount of material that contacts all or a portion of a surface. During a process to form one of the layers, the created layer forms on an outer surface, typically a top surface, of a substrate or substrate structure. The substrate may include a base layer introduced into a deposition process and any other or additional layers that may have been deposited onto the base layer in a prior deposition process or processes. Layers may be deposited over the entirety of a substrate with certain portions of the material later removed through laser ablation, scribing, or other material-removal process.

The manufacturing of a photovoltaic device generally includes sequentially, disposing the functional layers or layer precursors in the stack through one or more processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD).

Once a layer is formed it may be desirable to modify the physical characteristics of the layer through subsequent treatment processes. For example, a treatment process step may include passivation, which is defect repair of the crystalline grain structure, and may further include annealing imperfections or defects in the crystalline grain of the material that disrupt the periodic structure in the layer and can create areas of high resistance or undesirable current pathways that are, for example, parallel to but separated from the desired current pathway such as a shunt path or short.

An activation process may accomplish passivation through the introduction of a chemical dopant to the semiconductor layer stack as a bathing solution, spray, or vapor. Subsequently annealing the layer in the presence of the chemical dopant at an elevated temperature promotes grain growth and incorporation of the dopant into the layer. For many materials, a larger grain size, with fewer grain boundaries, reduces the resistivity of the layer, thereby allowing charge carriers to flow more efficiently. The incorporation of a chemical dopant may also make the regions of the semiconductor layer more n-type or more p-type and able to generate higher quantities of mobile charge carriers. Each of these features improves efficiency by increasing the maximum voltage the device can produce and reducing unwanted electrically-conductive regions. In the activation process, the process parameters of anneal temperature, chemical bath composition, and soak time for a particular layer depend on that layer's material.

The power output of a PV device is the product of the current (I, or sometimes J) and voltage (V) which can be shown by an I-V curve. At zero current or "open circuit," a maximum voltage is produced ($V_{OC}$) and at zero voltage or "short circuit," a maximum current is produced ($I_{SC}$). The product of these is the total potential power ($P_T$), given in watts (W), but this is not achievable in reality. The maximum power output ($P_{MAX}$) achievable is defined by the point on the IV curve that gives the largest product, $I_{MP}*V_{MP}$. Fill Factor (FF) is defined as the ratio of $P_{MAX}$ to $P_T$, i.e. the product of $I_{MP}*V_{MP}$ divided by the product of $I_{SC}*V_{OC}$. Higher FF is indicative of a more efficient cell. The conversion efficiency of a PV device is the ratio of the total potential power ($P_T$) discounted by FF, over the total incident power ($P_{in}$), and may be represented mathematically as: Efficiency=$(I_{SC}*V_{OC}*FF)/P_{in}$. One objective in the field of photovoltaic devices is the improvement of conversion efficiency. Increasing the sulfur or selenium content within an absorber comprising CdTe can alter the band gap energy. Increasing the selenium content from 0 atomic percent (at. %), to about 40 at. % compared to tellurium within an absorber consisting primarily of CdTe decreases the band gap energy, which improves infra-red absorption and can thereby increase current production.

Grading can be used to tune the bandgaps of CdTe based alloys to reduce surface recombination and increase absorption of the solar spectrum to improve the power conversion efficiency. The gradient may be formed by either depositing a material(s) having a desired gradient and material profile, or the gradient may be formed by depositing discrete layers of material that are subsequently annealed to create a desired concentration profile. Each layer can be graded as the layer moves away from the p-n metallurgical junction in order to optimize band-gap alignment and/or doping at the side in contact with the high doped contact layers.

The addition of one or more barrier layers or buffer layers may be used to inhibit diffusion of dopants or contaminants between layers. A buffer layer may be utilized to reduce the number of irregularities arising during the formation of a semiconductor.

In the present disclosure, when a layer is being described as being disposed or positioned "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any, particular orientation of the components unless otherwise stated. However, the orientation remains consistent within each embodiment or example, such that if B is "on" A, and C is "on" B, then B is necessarily between A and C, though not necessarily in contact with either.

In the present disclosure, when an object is being described as being "adjacent," it is to be understood that the word adjacent means "next to" and "in direct contact with" another object and is not synonymous with the term "on," although one object can be "on" and "adjacent" to another object.

Approximating language, as used herein throughout the specification and claims, may be applied to modify any quantitative representation that could permissibly vary without resulting in a change in the basic function to which it is related. Accordingly, a value modified by a term or terms, such as "about", "approximately," and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The term "transparent layer" as used herein, refers to a layer that allows an average transmission of at least 70% of incident electromagnetic radiation having a wavelength in a range from about 300 nm to about 900 nm. Radiation in this wavelength range is considered "light" for purposes of this invention, even though it may not be entirely in the visible range.

The term "absorber layer" as used herein refers to a semiconducting layer wherein the absorption of electromagnetic radiation causes electrons in the absorber layer to be excited from a lower energy "ground state" or "valence band" in which they are bound to specific atoms in the solid, to a higher "excited state," or "conduction band" in which they can move about within the solid.

As used herein, the "effective carrier density" refers to the average concentration of holes and electrons in a material.

As used herein, "n-type layer" refers to a semiconductor layer having an excess of electron donors as majority carriers; while a "p-type layer" refers to a semiconductor layer having an excess of electron acceptors (also known as "holes") as majority carriers. In each case the excess carriers (electrons or holes) may be provided by chemically doping the semiconductor with suitable dopants or may be generated by intrinsic defects present in the material. N-type layers and p-type layers that are chemically doped can have other materials in addition to n-type and p-type dopants. For example, a p-type layer of CdSeTe is a layer formed of Cd, Se, and Te that is also chemically doped p-type. For junction partners in PV device, n-type and p-type layers or materials interfaced together, adjacent one another. Generally, either the p-type material or layer or the n-type material or layer will serve as the "absorber layer" where electrons are excited as described above to generate the photovoltaic effect.

Semiconductors doped to be p-type or n-type are sometimes further characterized based on the density of respective majority charge carriers. Although the boundaries are not rigid, a material is generally considered p-type if electron acceptor carriers (i.e. "holes") are present in the range of about $1 \times 10^{11}$ cm$^{-3}$ to about $1 \times 10^{16}$ cm$^{-3}$, and p+type if acceptor carrier density is greater than about $1 \times 10^{16}$ cm$^{-3}$. Similarly, a material is considered n-type if electron donor carriers are present in the range of about $1 \times 10^{11}$ cm$^{-3}$ to about $1 \times 10^{16}$ cm$^{-3}$, and n+type if donor carrier density is greater than about $1 \times 10^{16}$ cm$^{-3}$. The boundaries are not rigid and may overlap because a layer may be p+ relative to a layer that is p-type (or n+ relative to a layer that is n-type) if the carrier concentration is at least 2 orders of magnitude (i.e. 100-fold) higher, regardless of the absolute carrier density. Additionally, some consider charge densities of greater than about $1 \times 10^{18}$ cm$^{-3}$ to be "++" type; and thus a layer of either n-type or p-type can be "++" relative to a layer of the same type that is itself "+" relative to yet a third layer, if the ++ layer has a same-type carrier density more than 100 fold that of the + layer.

While exemplary embodiments are presented, it should be appreciated that a vast number of variations exist. It should also be appreciated that the exemplary embodiment or exemplary embodiments are only examples, and are not intended to limit the scope, applicability, or configuration of the invention in any way. Rather, the detailed description provides those skilled in the art with a road map for implementing exemplary embodiments of the invention. It is to be understood that various changes may be made in the function and arrangement of elements described in an exemplary embodiment without departing from the scope of the invention as set forth in the appended claims.

In the following description, references are made to the accompanying drawings that form a part hereof, and which are shown by way of illustration, specific embodiments, or examples. Referring now to the drawings, in which like numerals represent like elements through the several figures, aspects of a photovoltaic device will be described.

The formation of stable, low resistance back contacts to CdTe solar cells can be challenging because typical metals used for back contacts to CdTe do not have work functions large enough to make good ohmic contacts to CdTe, and tend to form Schottky, or blocking barriers. A typical approach to overcome this obstacle is to either reduce the barrier or moderate its width by heavily doping the CdTe with Cu at the CdTe-back contact interface. Doing so may improve initial device performance, however, the diffusion of copper atoms from the back-contact region towards the heterojunction over time leads to decreased Voc and contributes to device degradation. Back-contact degradation typically results in reduced fill factor (FF), due to an increase in series resistance and/or the formation of a blocking back diode.

Other challenges to achieving higher efficiency are the difficulty in creating a satisfactory ohmic back contact for reducing back surface minority electron recombination, and maximal utilization of all wavelengths of available light. To collect more IR light, conventional techniques dictate using thicker absorber layers. However, since IR light penetrates too deeply, even for thick absorption layers, the efficient collection of charge carriers generated from these wavelengths is not feasible because the charge carriers are created outside the junction depletion region.

One way to increase collection of IR radiation, in conjunction with visible light, is to use a multi junction device. Multi-junction solar cells can achieve higher total conversion efficiency than single junction cells by capturing a larger portion of the solar spectrum. These devices can be formed as monolithically integrated structures with more than one p-n junction and with materials having different band-gap properties responsive to different ranges of the spectrum. For a device where the primary light source is from above, a light-incident upon the uppermost cell has a large band gap to capture energetic short wavelengths, while a lower cell has a smaller band gap and captures longer wavelengths and reflected photons. A multi-junction device may have two (tandem) or more sub-cells with tunnel junctions between the sub-cells.

Tunnel junctions serve a variety of different purposes. In photovoltaic cells, tunnel junctions form connections between successive p-n junctions, by connecting the n terminal of a first diode with a p terminal of a second diode or vice versa. Tunnel junction layers function as an ohmic electrical contact within a photovoltaic device.

There are challenges in using CdTe as a tunnel junction material in a multi junction device. One reason is because CdTe is difficult to effectively dope p+, which makes the creation of a tunnel junction in a CdTe layer problematic for some applications, such as a tandem cell. One solution to this challenge is to selectively match materials suitable for use with CdTe that can also be tuned by compositional variation to be p+ to produce a tandem cell with good absorption characteristics.

Diffuse light and light reflected off the ground and off nearby structures is available light that goes uncollected because it is reflected away by the rear of a solar panel, or is converted to heat. One solution to this light collection challenge is to make a double-sided, or bifacial device. Light may then be collected through both the primary or front surface as well as the secondary or back-side surface of a photovoltaic device into an interior absorber layer for conversion to current. Bifacial CdTe-based thin film devices have historically shown low conversion enhancement of the back side illumination, however, because the layer configuration causes rear-side-absorbed photons to be generated some distance from the heterojunction. One solution to this problem is to make a bifacial device with an electron reflector layer.

In bifacial embodiments, a plurality of thin-film semiconductor layers (a "stack") are sandwiched between the front side surface and the back side surface, the front side being the "sunny" side facing the solar radiation. Within the semiconductor stack, an outermost layer on the front side is an n-type transparent conductive oxide; an outermost layer on the back side is a secondary transparent conductive oxide, which may be p-type or n-type. Although a p-type transparent conductive layer would be preferred as a contact to the p-type absorber or interface layer, they are difficult to fabricate. An n-type transparent conductive layer is easier to fabricate, but requires a tunnel junction to contact the p-type absorber or p-type interfacial layer. A p+type interface layer is adjacent the n+type transparent conductive oxide; and a p-type absorber layer is between the p+type interface layer and the n-type transparent conductive oxide. Of course, there may also be substrates, superstrates, encapsulation layers, antireflection layers and/or other optional layers outside of (i.e. in front of) the front side surface or outside of (i.e. behind) the back side surface.

A photovoltaic device may include an electron reflector (ERF) layer to improve the flow of electrical current by providing an ohmic contact to achieve high performance efficiency, at the interface between the absorber layer and an interface layer or back contact layer. An electron reflector reduces charge loss between the absorber layer and the back contact by reducing the recombination of electron-hole pairs at the surface of the absorber layer closest to the back contact.

An ERF layer between a cadmium telluride (CdTe) or cadmium selenide telluride absorber layer and a back current pathway may be formed from a material which has a higher band gap than the absorber. The higher band gap ERF layer then provides a conduction-band energy barrier which requires higher energies for electron movement, thereby reducing the number of electrons having the tendency and energy to migrate across the ERF layer into the back contact where they may potentially recombine with holes flowing out the back contact.

An ERF layer may include a layer of Zinc Telluride (ZnTe), or Manganese Telluride (MnTe) or Magnesium Telluride (MgTe). Alternatively an electron reflector layer may include a layer of ternary compound such as Cadmium Zinc Telluride (CdZnTe), Cadmium Manganese Telluride (CdMnTe) or Cadmium Magnesium Telluride (CdMgTe), or the combinations of the binary and ternary compounds or other materials that have appropriate band gap structure. These and similar compounds may be characterized generically by the formula $Cd_zM_{(1-z)}Te$, where M represents Zn, Mg or Mn, and z is from 0 to about 99 at. %, typically from 0 to about 60 at. %.

In some structures, an ERF may include a dopant. In some embodiments an ERF comprises a layer of ZnTe doped with Copper Telluride ($Cu_2Te$) up to a 5% concentration on an atomic basis. Alternatively, an electron reflector layer may include a hi-layer of materials having different compositions, with a first layer including ZnTe or cadmium zinc telluride (CZT or CdZnTe) and a second layer including $Cu_2Te$. In some embodiments, an electron reflector may be between 5 nm to 25 nm thick or between about 15 nm to 20 nm thick.

In some embodiments, an ERF may have a dopant gradient through the thickness of the ERF. For example the concentration of $Cu_2Te$ may be 0.01% at an absorber/ERF junction increasing to 5% at the junction between the ERF and a back electrode layer. The dopant gradient may increase stepwise or it may be continuously increasing. Electron reflectors are more fully discussed in co-owned U.S. Pat. No. 9,269,849, which is herein incorporated by reference in its entirety.

Turning now to the figures, FIG. 1 depicts an embodiment of a photovoltaic device 100 according to the invention, wherein a number of layers are shown and described. The layers described, the materials used, and/or the methods of forming the layers of the photovoltaic device 100 may be substituted, included in addition to layers described, or be absent in the embodiments of the invention described herein below and illustrated in the figures. It is further understood that each of the layers may be deposited in a single layer deposition from a single material, from a multi-layer process from a single material, or from a multi-layer process from a plurality of materials.

The photovoltaic device 100 of FIG. 1 includes a substrate layer 110, a first transparent conductive oxide (TCO) layer 120, a first p-type absorber layer 130, an interface layer 140, and a transparent contact layer 150 wherein the transparent contact layer 150 serves as a back contact. The photovoltaic device further includes electrical connections that provide a current path to communicate generated current flow, such as from one photovoltaic cell to adjacent cells in a module or from one photovoltaic module to adjacent modules in an array. Alternatively, the electrical connections may direct the current flow to an external load device where the photo-generated current provides power. In an embodiment, the first TCO layer 120 serves as the front electrode where a first conductive lead is attached and the transparent contact layer 150 serves as the back electrode where a second conductive lead is attached.

The substrate layer 110 provides a surface upon which layers of material are disposed to create the photovoltaic device. The substrate layer 110 comprises any suitable substrate, such as soda lime glass, float glass or low-iron glass. Alternatively, the substrate layer 110 may include polymeric, ceramic, or other materials that provide a suitable structure for forming a base of a photovoltaic cell. The substrate is not essential to the invention, but is a practical medium for applying the subsequent thin film layers. Although layers are generally, described herein in a superstrate configuration, in which front side light is incident through the substrate, a true "substrate" configuration, in which the substrate is on the side of the back contact, is also possible.

The substrate layer 110 may have various surface coatings on the internal and external surfaces, in the context of the finished device. The substrate layer 110 may have additional external layers applied that improve the transmission of light and device performance, which may include anti-reflective coatings and/or anti-soil coatings. The substrate may also have coatings on the internal surface, such as for example, a buffer layer or a barrier layer. A barrier layer may be used to promote the chemical stability of the substrate layer 110 by inhibiting diffusion of ions from, into, or across the substrate. The barrier layer may be formed of, for example, silicon nitride, silicon oxide, aluminum-doped silicon oxide, boron-doped silicon nitride, phosphorus-doped silicon nitride, silicon oxide-nitride, or combinations or alloys thereof.

The first TCO layer 120 provides a transparent, electrically conductive material serving as a front electrode to the photovoltaic device to communicate a generated electrical current to a circuit, which may include an adjacent photovoltaic device, such as to adjacent cells within a photovoltaic module. The internal coatings together with at least one transparent conductive oxide layer comprise a TCO stack.

The first TCO layer 120 may be formed from a transparent conductive oxide. Exemplary transparent conductive oxides include, but are not limited to, tin oxide, zinc oxide, zinc sulfide, cadmium oxide and gallium oxide, which may be doped with elements like indium, fluorine, or other dopants; such as indium gallium oxide, indium tin oxide, indium zinc oxide, cadmium stannate ($Cd_2SnO_4$), cadmium tin oxide, indium doped cadmium oxide, fluorine doped tin oxide, aluminum doped zinc oxide, indium tin oxide, and combinations and doped variations thereof.

In the embodiment shown in FIG. 1, the TCO is doped to form an n-type semiconducting layer. The first TCO layer 120 can be formed over the substrate layer 110, or a barrier layer (if included). In one particular embodiment, the first TCO layer 120 comprises a bilayer of a fluorine doped tin oxide layer ($SnO_2$:F) with an undoped, $SnO_2$ layer.

The TCO stack may further include additional material layers applied over first TCO layer 120 surface, such as a buffer layer that promotes the electrical function of the TCO or that provides an improved surface for the subsequent deposition of semiconductor materials. In an embodiment, a barrier layer is formed over the first TCO layer and comprises a material selected from: tin oxide, zinc tin oxide, zinc oxide, zinc oxysulfide, or zinc magnesium oxide. In an embodiment, the first TCO layer 120 comprises fluorine doped tin oxide layer ($SnO_2$:F) having a carrier concentration of $1 \times 10^{17}$ to $1 \times 10^{19}$ $cm^{-3}$, with an undoped, higher resistivity $SnO_2$ buffer layer deposited on the TCO layer 120. The $SnO_2$ buffer layer has a thickness of about 20 nm to 100 nm.

In some embodiments an optional n-type window layer is disposed between the first TCO layer 120 and the first absorber layer 130 to serve as an n-type semiconductor junction partner for a p-type absorber. Cadmium sulfide and other suitable n-type window semiconductors may be used. In other configurations, as shown in FIG. 1, window layers are optional and may be omitted, in which case the TCO layer 120 may serve as the n-type junction partner. Thin film devices without a conventional window layer are more fully discussed in co-owned U.S. Patent Pub. No. 2016/0126395 A1, which is herein incorporated by reference in its entirety.

The first absorber layer 130 is disposed over the first TCO layer 120 and the substrate layer 110. The first absorber layer 130 comprises a p-type semiconductor material to form a p-type region within the photovoltaic device 100. In an embodiment, the first TCO layer 120 and the first absorber layer 130 form a n-p junction. The first absorber layer 130 absorbs photons passing through the first TCO layer 120 to mobilize charge carriers. The first absorber layer 130 may be ternary alloy formed from cadmium telluride containing selenium (CdSeTe). Using Se with CdTe in the first absorber layer 130 provides additional control over bandgap ($E_g$) variation because the bandgap of the first absorber layer 130 is altered by the presence of Se therein. For example, the bandgap of the first absorber layer 130 is decreased by increasing Se content up to 40 at. % compared to Te. In an embodiment, the composition of the first absorber layer 130 may be represented by the formula $CdSe_xTe_{(1-x)}$ where x is between about 1 and about 40 at. % (i.e., about 0.01 to about 0.40). If graded, the highest concentration can be between about 15 at. % and about 40 at. % (i.e., about 0.15 to about 0.40) such as, for example, between about at. % 15 and 30 at. % (i.e., about 0.15 to about 0.40). The first absorber layer 130 may be between 0.5 µm to 8.0 µm thick, or between 1.0 µm to 3.5 µm thick, or between 1.85 and 2.25 µm thick. In one exemplary embodiment the first absorber layer 130 is 2.1 µm $CdSe_xTe_{(1-x)}$ where the average value of x is less than 25 at. %.

The first absorber layer 130 may be formed by a layer of material that is deposited on the photovoltaic device 100, or the first absorber layer 130 may be formed by a plurality of layers of material deposited on the photovoltaic device 100 that are processed, such as by annealing, to form an alloy. A gradient may be formed within the first absorber layer 130 represented by a continuous increase in concentration, a stepwise change in concentration or the like. Such a gradient may apply to Se in the case of a ternary alloy, wherein the value of "x" varies throughout the thickness of the absorber, or to a dopant in the absorber.

The interface layer is indicated at 140. The interface layer 140 comprises zinc telluride or cadmium zinc telluride heavily doped p+ with copper, silver, or gold, and may be represented by the formula $Cd_yZn_{(1-y)}Te$:D, wherein y may be from 0 to about 90 at. %, for example, from 0 to about 60 at. %, or from about 30 at. %, to about 60 at. %, and ":D" indicates a dopant in the formula.

In the case of a tandem solar cell, the $Cd_yZn_{(1-y)}Te$ layer doped with Cu forms the p+layer of a tunnel junction connecting the first ("top") and second ("bottom") solar cells as shown in FIG. 9. In other embodiments, the interface layer 140 comprises $Cd_yZn_{(1-y)}Te$:D doped with a different noble metal (such silver or gold), a Group V material (such as nitrogen, phosphorous, or arsenic), or a combination of materials from both groups. The interface layer 140 ranges in thickness from 10 nm to 50 nm. In one particular embodiment, the interface layer 140 is Cu doped ZnTe with a thickness of 25 nm and a copper concentration of 0.01 to 1.0% Cu by atomic weight.

The transparent contact layer 150 must be transparent and exhibit suitable electronic characteristics for a back contact to the first absorber layer 130 and the capability to serve as a n+layer of a tunnel junction. Among the desired electronic properties is that the work function is a good match to the electron affinity of the first absorber layer 130 such that the positive charge carriers (holes) can flow readily into the transparent contact layer 150. The transparent contact layer 150 comprises a transparent conductive oxide (TCO) that is heavily doped n+. Some suitable doped oxides include zinc oxide or tin oxide doped with aluminum, indium, or fluorine, or cadmium stannate. Other TCOs capable of being heavily doped n+ may also be suitable.

The transparent contact layer 150, in conjunction with the interface layer 140, functions as transparent tunnel junction. In bifacial embodiments, as shown in FIG. 1 and FIG. 8, the transparent contact layer 150 allows light incident on a rear surface to pass through to the absorber and serves as a back contact. In ORF embodiments, as shown in FIG. 5, the transparent contact layer 150, transmits light bidirectionally: first from the absorber through to a reflective surface of the ORF, and second to pass reflected light back through layer 150 to the absorber layer again. In a tandem device, as shown in FIG. 9, the heavily doped transparent contact layer 150 forms the n+ layer of a tunnel junction connecting the first ("top") cell 410 and second ("bottom") cell 420.

Thus, the transparent contact layer 150 serves more than one purpose. First, the transparent contact layer 150 allows reflected light and back-side incident light to enter from the back of the photovoltaic device 100 to be captured by the first absorber layer 130 to generate electrons and holes. Second, the transparent contact layer 150 is a n+ tunnel junction layer allowing a more efficient transport of holes from the first absorber layer 130 to the back electrical connection by reducing inadvertent electron/hole recombination that occurs between conventional back contact and back electrode layers. Third, it provides a transparent ohmic contact for use in a multi-junction device.

In some embodiments, the transparent contact layer 150 is AZO wherein the aluminum doping level is in a range from 2 at. % to 8 at. % and the thickness is in a range from 20 nm to 1000 nm. In an embodiment, the aluminum doping level is 5 at. % and the transparent back contact layer 150 is about 500 nm thick.

In the embodiment of FIG. 1 and in all other embodiments described herein, the transparent conductive layer 120 refers to an electrically conductive layer that is transparent, which can serve as a front electrical contact. Similarly, the transparent contact layer 150 is also an electrically conductive layer that is transparent, and which can also serve as a back electrical contact in a bifacial or ERF embodiment.

FIG. 1 depicts an optically bifacial photovoltaic device 100. A bifacial photovoltaic device 100 can collect light incident on a front surface through the first TCO layer 120 and collect light incident on a rear surface through the transparent contact layer 150. The performance of the photovoltaic device 100 can be improved by adjusting the thicknesses of layers, such as the first absorber layer 130 and the transparent contact layer 150, passivating the back contact interface to reduce electron-hole recombination, and/or utilizing a secondary conductor. One such implementation is depicted in FIG. 2.

Figure 2:
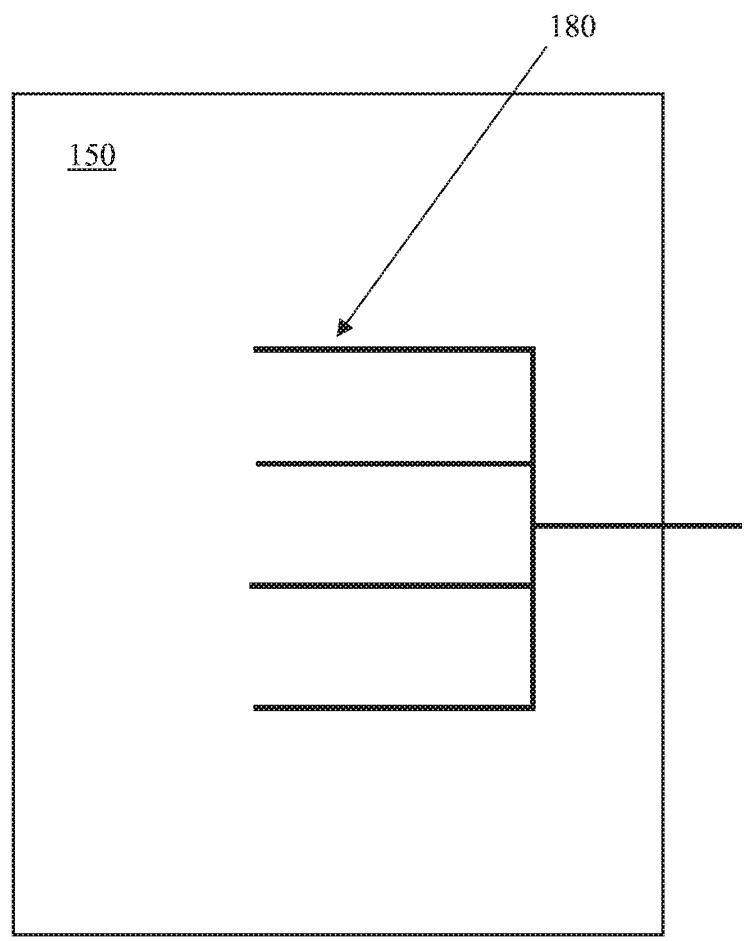
FIG. 2 is a bottom view of the photovoltaic device of FIG. 1 with the addition of metallic grid fingers.

FIG. 2 shows the device of FIG. 1 with the addition of a secondary conductor 180. The secondary conductor 180 may be a set of metallic grid fingers spaced apart to allow light to pass into the photovoltaic device 100 from the rear through the transparent contact layer 150. The secondary conductor 180 can be used in combination with a thinner transparent contact layer 150. In some embodiments, the device back contact consists essentially of the transparent contact layer 150 and the secondary conductor 180. In some embodiments, having a secondary conductor 180, the transparent contact layer 150 is aluminum doped zinc oxide wherein the aluminum doping level is about 5 to 6 at. %, with a thickness less than 500 nm. In some embodiments the transparent contact layer 150 thickness is between 100 nm and 300 nm.

In some embodiments, the secondary conductor 180 comprises parallel wires. In some embodiments, the secondary conductor 180 comprises parallel metallic ribbons, wider in the cross-stack direction to carry more current, and narrower in the cross-plane direction to minimize shading and obscuration loss. In some embodiments, the secondary conductor 180 composition comprises one or more materials selected from: Au, Cu, Al, and Ag. In some embodiments, the secondary conductor 180 composition is substantially free of copper. In some embodiments, the secondary conductor 180 is embedded, or partially embedded, in the transparent contact layer 150. In some embodiments, the secondary conductor 180 is adjacent to, and directly contacting, the transparent contact layer 150. In some embodiments, the back side may further comprise a back surface layer or encapsulant. In some embodiments, the secondary conductor 180 contacts and is adjacent to the transparent contact layer 150 and is embedded, or partially embedded, in a back surface layer or encapsulant.

In some embodiments, the composition of the back surface layer, the secondary conductor 180, the transparent contact layer 150, and the interface layer 140 are all substantially free of copper. In some embodiments, the composition of the back surface layer, the secondary conductor 180, the transparent contact layer 150, and the interface layer 140 are all substantially free of graphite.

Quantum efficiency (QE) is a combination of the generation of electron-hole pairs and the effectiveness of carrier collection within a solar cell. QE is the ratio of charge carriers produced to the incident photons. A QE value indicates the amount of current that a photoelectric device will produce when irradiated by photons of a particular wavelength. The photoelectric device quantum efficiency (QE) may be integrated over a solar spectral range, and the QE may be expressed as a percentage value. Therefore, the QE can be used in predicting the amount of current that a photovoltaic cell will produce when exposed to sunlight or other incident light.

Figure 3:
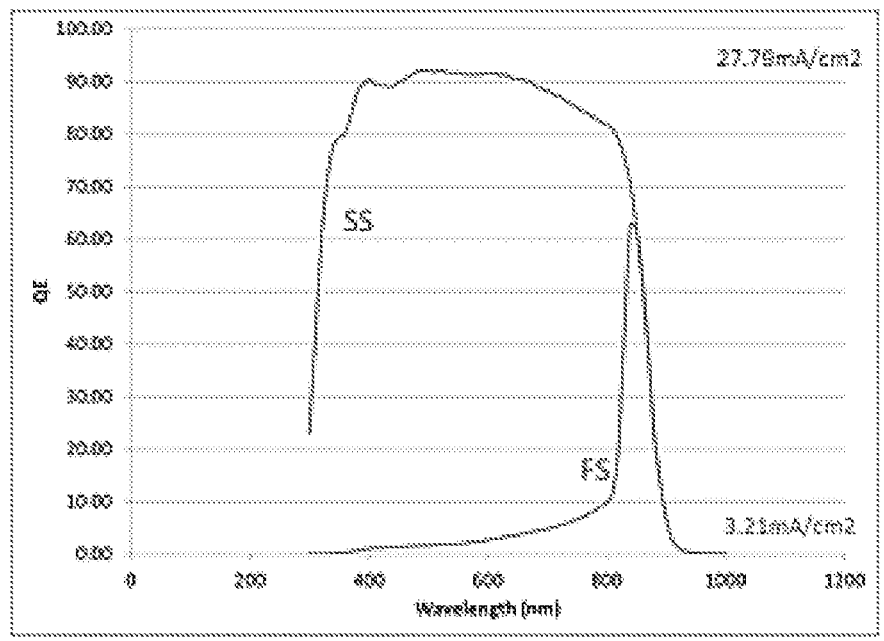
FIG. 3 depicts QE measurements for front-side (SS) and back-side (FS) illumination for an exemplary bifacial embodiment of FIG. 1.

FIG. 3 depicts Quantum Efficiency (QE) measurements for front-side (SS) and back-side (FS) illumination of a bifacial photovoltaic device having a first (CdSeTe) absorber layer 130 2.1 µm thick and a 500 nm thick aluminum-doped zinc oxide (AZO) transparent contact layer 150. The QE measurements were taken by directly illuminating the front-side (SS) and the back-side (FS) with an identical light source. As can be seen from the back-side (FS) illumination portion of the curve there is current collection occurring through the transparent contact layer 150 (here, AZO), particularly in the red and infrared end of the spectrum, with significant back-side IR light absorption between 800 and 900 nm. These results demonstrate the ability to use AZO in a bifacial solar cell configuration and show good IR absorption. Back-side (FS) collection can be further improved by adjusting the thicknesses of layers, such as the first absorber layer 130 and the transparent contact layer 150, passivating the back contact interface to reduce electron recombination, and/or utilizing a secondary conductor. FIG. 3 also shows that in the limit of thin absorbers, back-side (FS) QE converges with front-side (SS) QE.

FIG. 4 provides an I-V curve showing the performance of the photovoltaic device, as well as the values for typical cell performance parameters such as current density (JQE), and fill factor (FF). As can be seen, the current density is 27.8 mA and FF is 72%. The observed non-rectifying I-V curve indicates that ohmic tunnel junctions can be formed with the use of an AZO transparent contact layer 150. This allows for practical tunnel junctions utilizing typical CdTe processes for the formation of the first p+ tunnel junction layer and cost-efficient manufacturing processes for the creation of the second n+ tunnel junction layer.

FIG. 5 is a depiction of an exemplary photovoltaic device 200. The photovoltaic device 200 of FIG. 5 is constructed similarly to that of the photovoltaic device of FIG. 1 with the addition optical reflector layer 160. The optical reflector (ORF) layer 160 is disposed on the transparent contact layer 150 to improve the efficiency of the photovoltaic cell 200. Some light wavelengths pass through the photovoltaic cell 200 without being absorbed in the first absorber layer 130. The purpose of the ORF layer 160 is to reflect this unabsorbed light back into the first absorber layer 130 where the light gets a second chance to be absorbed to increase carrier generation and thereby increase efficiency. The optical reflector layer 160 comprises metallic Au, Ag, Al or other suitable material. In one exemplary embodiment, the ORF layer 160 comprises a metallic Au layer in a thickness between 20 nm and 500 nm, typically between 50 and 200 nm, for example between 75 and 150 nm. In some embodiments, the ORF may be deposited as a bilayer of aluminum with a thin layer of either gold or silver as a second layer.

To obtain both good optical transmission and electrical contact in the embodiment of FIG. 5, the transparent contact layer 150 is disposed between the transparent interface layer 140 and the optical reflector layer (ORF) 160. Together, the transparent contact layer 150 and the optical reflector layer 160 form a back contact. In one exemplary embodiment, the transparent contact layer 150 is 5 at. % Al doped ZnO ranging in thickness between 20 nm and 150 nm. Note this is distinct from the first TCO layer, which may optionally be a bilayer of fluorine-doped $SnO_2/SnO_2$ as described above.

The curve of FIG. 6 is a QE comparison between a molybdenum nitride (MoNx/Mo) bilayer back contact and an exemplary embodiment of FIG. 5 with an AZO/Au Mayer back contact. The QE curve shows efficiency gains at long wavelength light realized by using an AZO/Au back contact rather than a metal oxide back contact such as molybdenum nitride (MoNx/Mo or MoNx/Al). As can be seen, there is enhanced current collection by the AZO/Au back contact at wavelengths between about 0.8-0.9 μm (800-900 nm) demonstrating a positive optical reflection effect from the AZO/Au back contact. There is little value in adding a high reflective metal on MoNx because its high absorption compared to AZO obscures any, reflective benefit.

FIGS. 7A and 7B present I-V curves to compare the performance of an exemplary embodiment of FIG. 5 having an AZO/Au back contact with a particular thickness. FIGS. 7A and 7B each provide the values for typical cell performance parameters such as open circuit voltage (Voc), short circuit current density (here denoted Jsc), and fill factor (FF). As can be seen, there is little Jsc difference observed between a 20 nm and 150 nm ZnO:Al back contact. This result demonstrates that AZO layer thickness does not significantly affect current because of the good transparency of the AZO. In addition, comparing the I-V curves from FIGS. 7A and 7B with FIG. 4 shows that the addition of the optical reflector layer 160 to form an AZO/Au back contact performed well by generating more current and voltage than the device utilizing a 500 nm thick AZO transparent contact layer 150 without an optical reflector layer.

Other transparent contact layers performed equally well or better. FIG. 10 compares the efficiencies of additional PV devices having an ORF 160 as in FIG. 5, but having varying ORF/back contact compositions. In each case the experimental compositions were within a few percentage points of a 10 nm MoNx/Al back contact, which served as the control to which the data are normalized. The experimental ORF/back contacts were bilayers of a 20 nm metal oxide layer and a 120 nm aluminum metal layer. The oxide layers were cadmium stannate (Cd2SnO4), aluminum doped zinc oxide (AZO), and indium doped tin oxide (ITO).

FIG. 8 is a depiction of an exemplary photovoltaic device 300. The photovoltaic device 300 is a bifacial embodiment similar to the embodiment depicted in FIG. 1 with the addition of an optional first window layer 185 and an optional electron reflector (ERF) layer 170. The optional first window layer 185 is disposed on the first TCO layer 120 and may be formed from a substantially transparent n-type semiconductor material such as, for example, CdS, CdSSe, CdSe, zinc sulfide (ZnS), ZnSe, ZnTe, a ZnS/CdS alloy, ZnSO, cadmium magnesium sulfide, or another suitable wide-band gap and stable material. The first window layer 185 is disposed between the first transparent conductive oxide layer 120 and the first absorber layer 130.

When utilizing the n-type first window layer 185, an optional high resistivity transparent (HRT) layer or buffer layer may be disposed between the first TCO layer 120 and first window layer 185 to promote electrical function of the TCO, such as preventing shunt defects or reducing the effect of pinholes or weak diodes, or to provide an improved surface for the subsequent deposition of semiconductor materials. The HRT layer may be a bilayer utilizing $SnO_2$ plus an intrinsic $SnO_2$ layer between the low resistance $SnO_2$ and the first window layer 185. Or, the HRT layer may be any one of the group specified for the first TCO layer 120 but without doping so that the electrical resistance is high. In an embodiment, the HRT is ZnO or $SnO_2$ with a thickness of about 25 nm to about 200 nm. In an embodiment, the HRT is ZnO or $SnO_2$ with a thickness from about 50 nm to about 100 nm. The buffer layer may be formed of, for example, tin oxide, zinc tin oxide, zinc oxide, zinc oxysulfide, or zinc magnesium. The photovoltaic device 200 may omit the first window layer 185, due to the presence of the n-type first TCO layer 120.

The ERF layer is deposited between the first absorber layer 130 and the interface layer 140, which is part of the tunnel junction. The ERF layer 170 may include CdZnTe ("CZT"), CdMnTe, CdMgTe, or similarly suitable materials with a higher band gap than the $CdSe_xTe_{(1-x)}$ first absorber layer 130, as described above. In one embodiment, the ERF 170 is a zinc telluride (ZnTe) layer doped with copper telluride ($Cu_2Te$). In this embodiment, the ERF 170 contains primarily ZnTe with a $Cu_2Te$ dopant present in concentrations up to 5 at. %. The ERF 170 may be between about 5 nm to about 25 nm thick.

The higher band gap ERF layer 170 provides a conduction-band energy barrier which requires higher energies for electron movement across it. This makes it more difficult for electrons to move out of the first absorber layer 130 toward the transparent contact layer 150 where they may recombine with the concentration of holes, and instead, reflects the electrons toward the first TCO layer 120, contributing to current collection and decreasing charge carrier recombination. Minimizing crystal lattice defects, such as by passivation at the ZnO:Al layer also contributes to decreasing the concentration of recombination sites, and thereby increases rear side energy collection. In an embodiment, an ERF layer 170 is used in a device with an optical reflector layer 160.

FIG. 9 shows one embodiment of a tandem photovoltaic device 400. The photovoltaic device 400 includes the elements of photovoltaic device 100 from FIG. 1, plus additional layers. The tandem photovoltaic device 400 comprises a first ("top") cell 410 and a second ("bottom") cell 420 connected by a tunnel junction. In tandem thin-film solar cells, desirable characteristics for a TCO front-contact include: high band-gap, high transmission of incident light, high conductivity and low resistivity.

The first ("top") cell comprises a substrate layer 110, a first transparent conductive oxide (TCO) layer 120, an optional high resistivity transparent (HRT) layer 195 disposed on the first TCO layer 120, an optional n-type first window layer 185, a p-type first absorber layer 130. The tunnel junction between top cell 410 and bottom cell 420 includes a heavily p+ doped interface layer 140 that forms the p+layer of a tunnel junction and a heavily n+ doped transparent contact layer 150 that forms the n+layer of a tunnel junction. In some embodiments, the p+layer of the tunnel junction comprises the final p+ ZnTe layer of the top cell and the n+layer comprises a transparent conducting oxide such as zinc oxide doped with aluminum.

With continued reference to FIG. 9, the second ("bottom") cell comprises a second transparent conductive oxide (TCO) layer 220, a n-type second window layer 285 (optional), a p-type second absorber layer 230, and a metal back contact 290. The metal back contact 290 may include gold, platinum, molybdenum, tungsten, tantalum, palladium, aluminum, chromium, nickel, or silver. The second cell receives the solar light transmitted through the first cell.

In one embodiment, the first cell utilizes $CdSe_xTe_{(1-x)}$ for the p-type first absorber layer 130 and the second cell utilizes a p-type second absorber 230 with a bandgap that is lower than the band-gap of the first absorber; for example a bandgap of about 1.4-2.2 eV in the first absorber and about 0.6 to 1.4 eV in the second absorber. These bandgaps can be selectively tuned up or down by the addition of dopants using methods known in the art. For example, Se can be used with CdTe absorbers to tune a bandgap down while Zn can be used to tune a bandgap up. In addition, the layers comprising the n-p junction can be graded to tune the bandgaps at the junction to significantly reduce surface recombination and increase absorption of the solar spectrum to improve power conversion efficiency. In alternative embodiments, one may employ an n-type absorber and the tunnel junction may be reversed in its order or may be unnecessary.

The photovoltaic device 400 further includes electrical connections that provide a current path to communicate generated current flow, such as from one photovoltaic cell to adjacent cells in a module or from one photovoltaic module to adjacent modules in an array. Alternatively, the electrical connections may direct the current flow to an external load device where the photo-generated current provides power.

In a monolithically integrated, series connected, two-terminal device, the second cell is electrically connected to the first cell through the p+/n+ tunnel junction.

In a stacked, parallel connected, four-terminal device, the tunnel junction transmits light to the lower cell and the n+ layer of the tunnel junction functions as a back contact for the top cell. In an embodiment, a first conductive lead is connected to a first TCO layer 120; a second conductive lead is connected to the transparent contact layer 150; a third conductive lead is connected to the second TCO layer 220; and a fourth conductive lead is connected to the metal back contact 290.

In embodiments of the invention, methods, apparatuses and/or structures provide for the following: device layers with energy band-gaps in the range between approximately 1.1 eV and 2.1 eV; optional compositional grading of heterojunction layers to optimize the structure and reduce interface recombination; transparent back contact and tunnel junction layers suitable for bifacial and multi-junction devices; the production of heavily doped material grown over a superstrate or substrate, in situ, near front and back contacts to create one or more ohmic contacts; reduced recombination of electrons and holes, and providing cost effective structures. In embodiments, the capabilities above, when combined, allow for control over light absorption and charge carrier flow in the device for optimized performance. Examples of tuned tandem solar cells producing high efficiencies are described. Methods and structures of the present disclosure can provide photovoltaic devices with improved short circuit current (Jsc), open circuit voltage (Voc), and fill factor (FF) in relation to prior art thin film photovoltaic devices.

The principle and mode of operation of this invention have been explained and illustrated in its preferred embodiments. However, it must be understood that this invention may be practiced otherwise than as specifically explained and illustrated without departing from its scope.

What is claimed is:
1. A photovoltaic device comprising:
   a junction formed by a top cell, a bottom cell and a transparent tunnel junction between the first cell and second cell;
   the top cell including:
      a glass substrate;
      a first transparent conductive oxide layer residing over the substrate;
      a high-resistivity layer residing over the first transparent conductive oxide layer, the high-resistivity layer including:
         a thickness of the high-resistivity layer having a range of 25 nm to 200 nm;
         a n-type first window layer residing over the high-resistivity layer;
         a p-type first absorber layer residing over the n-type first window layer;
   the transparent tunnel junction including:
      an interface layer doped p+ with a Group V dopant, the interface layer including:
         zinc and tellurium;
         a thickness having a range from 10 nm to 50 nm;
         a charge carrier concentration 100 times or greater than a charge carrier concentration of the first absorber layer;
      an electron reflector layer, the electron reflector layer including:
         a thickness of the electron reflector layer having a range of 5 nm to 25 nm;
      a transparent contact layer doped n+ residing over the interface layer, the transparent contact layer including:
         a thickness of the transparent contact layer in a range from 20 nm to 1000 nm;
   the bottom cell including:
      a second transparent conductive oxide layer residing over the transparent contact layer;
      a n-type second window layer residing over the second transparent conductive oxide layer;
      a p-type second absorber layer residing over the second window layer, the p-type second absorber layer including:
         a second bandgap that is lower than a first bandgap of the first absorber layer; and
      a back contact layer residing over the second absorber layer.

2. The photovoltaic device of claim 1, wherein the p-type first absorber layer is $CdSe_xTe_{(1-x)}$, and the amount of Se in the p-type first absorber layer graded through the thickness of the p-type first absorber layer and the x having a range of 0.15 to 0.40.

3. The photovoltaic device of claim 1, further comprising an optical reflector layer between the transparent contact layer and the second transparent conductive oxide layer.

4. The photovoltaic device of claim 3, wherein the optical reflector layer includes:
a first layer of gold, silver or aluminum; and
a thickness of the optical reflector layer having a range of 20 nm to 500 nm.

5. The photovoltaic device of claim 4, wherein the optical reflector layer includes a second layer composed of a different material than the first layer.

6. The photovoltaic device of claim 1, wherein the transparent contact layer includes zinc oxide.

7. The photovoltaic device of claim 6, wherein the zinc oxide is doped with aluminum, indium, fluorine, or cadmium stannate.

8. The photovoltaic device of claim 7, wherein the transparent contact layer is aluminum zinc oxide having an aluminum doping level in a range from 2 at. % to 8 at. %.

9. The photovoltaic device of claim 1, wherein the transparent contact layer includes tin oxide.

10. The photovoltaic device of claim 9, wherein the tin oxide is doped with aluminum, indium, fluorine, or cadmium stannate.

11. The photovoltaic device of claim 1, wherein the high-resistivity layer is tin oxide, zinc tin oxide, zinc oxide, zinc oxysulfide or zinc magnesium.

12. The photovoltaic device of claim 1, wherein the interface layer includes $Cd_yZn_{(1-y)}Te:D$.

13. The photovoltaic device of claim 12, wherein the $Cd_yZn_{(1-y)}Te:D$ interface layer is doped with copper, gold, silver, Group V material or a combination thereof.

14. The photovoltaic device of claim 13, wherein the y of $Cd_yZn_{(1-y)}Te:D$ including a range from 0 to 90 at. %.

15. The photovoltaic device of claim 1, wherein the p-type first absorber layer includes cadmium and tellurium.

16. The photovoltaic device of claim 1, wherein the p-type first absorber layer includes cadmium, tellurium and selenium.

17. The photovoltaic device of claim 1, wherein the p-type first absorber layer includes a thickness of the p-type first absorber layer in a range of 0.5 µm to 2.25 µm.

18. The photovoltaic device of claim 1, wherein the first window layer is CdS, CdSSe, CdSe, ZnS, ZnSe, ZSnTe, Zns alloy, CdS alloy, ZnSO or cadmium magnesium sulfide.

19. The photovoltaic device of claim 1, wherein the contact layer and the interface layer are substantially free of copper.

20. The photovoltaic device of claim 1, wherein the contact layer and the interface layer are substantially free of graphite.

21. A photovoltaic device comprising:
a junction formed by a top cell, a bottom cell and a transparent tunnel junction between the first cell and second cell;
the top cell including:
a glass substrate;
a first transparent conductive oxide layer residing over the substrate;
a high-resistivity layer residing over the first transparent conductive oxide layer, the high-resistivity layer including:
a thickness of the high-resistivity layer having a range of 25 nm to 200 nm;
a top cell junction including:
a n-type first window layer residing over the high-resistivity layer;
a $CdSe_xTe_{(1-x)}$ p-type first absorber layer residing over the n-type first window layer;
the transparent tunnel junction including:
a $Cd_yZn_{(1-y)}Te:D$ interface layer the interface layer including:
a dopant of copper, gold, silver, platinum palladium, rhodium, ruthenium, iridium, osmium or Group V material;
a thickness having a range from 10 nm to 50 nm;
a charge carrier concentration 100 times or greater than a charge carrier concentration of the first absorber layer;
an electron reflector layer, the electron reflector layer including:
a thickness of the electron reflector layer having a range of 5 nm to 25 nm;
a transparent contact layer doped n+residing over the interface layer, the transparent contact layer including:
tin oxide or zinc oxide;
a thickness of the transparent contact layer in a range from 20 nm to 1000 nm;
the bottom cell including:
a second transparent conductive oxide layer residing over the transparent contact layer;
an optical reflector layer between the transparent contact layer and the second transparent conductive oxide layer, the optical reflector layer including:
a thickness of the optical reflector layer having a range of 20 nm to 50 nm;
a first layer of gold, silver or aluminum;
a second layer composed of a different material than the first layer;
a bottom cell junction including:
a n-type second window layer residing over the second transparent conductive oxide layer;
a p-type second absorber layer residing over the second window layer, the p-type second absorber layer including:
a second bandgap that is lower than a first bandgap of the first absorber layer; and
a back contact layer residing over the second absorber layer.

* * * * *